United States Patent
Baptist et al.

(10) Patent No.: US 10,241,865 B2
(45) Date of Patent: Mar. 26, 2019

(54) HANDLING STORAGE UNIT FAILURE IN A DISPERSED STORAGE NETWORK

(71) Applicant: International Business Machines Corporation, Armonk, NY (US)

(72) Inventors: Andrew D. Baptist, Mt. Pleasant, WI (US); Dustin M. Hendrickson, Chicago, IL (US); Wesley B. Leggette, Chicago, IL (US); Manish Motwani, Chicago, IL (US); Brian F. Ober, Lake in the Hills, IL (US); Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 212 days.

(21) Appl. No.: 15/433,311

(22) Filed: Feb. 15, 2017

(65) Prior Publication Data
US 2018/0232276 A1  Aug. 16, 2018

(51) Int. Cl.
| | | |
|---|---|---|
| *G06F 11/00* | (2006.01) | |
| *G06F 11/10* | (2006.01) | |
| *G06F 17/30* | (2006.01) | |
| *H04L 29/08* | (2006.01) | |
| *G06F 11/20* | (2006.01) | |
| *H03M 13/00* | (2006.01) | |

(52) U.S. Cl.
CPC ...... *G06F 11/1092* (2013.01); *G06F 11/2053* (2013.01); *G06F 17/303* (2013.01); *H03M 13/616* (2013.01); *H04L 67/1097* (2013.01)

(58) Field of Classification Search
CPC ............ G06F 11/1092; G06F 11/2053; G06F 11/203; H04L 67/1097
See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |
| | (Continued) | |

OTHER PUBLICATIONS

Shamir; How to Share a Secret; Communications of the ACM; vol. 22, No. 11; Nov. 1979; pp. 612-613.

(Continued)

*Primary Examiner* — Philip Guyton
(74) *Attorney, Agent, or Firm* — Garlick & Markison; Timothy W. Markison; Bruce E. Stuckman (57) ABSTRACT

A method for execution by dispersed storage failure detection unit of a dispersed storage network includes generating a storage unit weights and storage set weights based on the storage unit weights. One storage unit that meets a weight-adjustment trigger condition is identified, and a new storage unit weight for the identified storage unit is generated. A first data migration within the storage set that includes the identified storage unit is facilitated based on the storage unit weights. A failing set of storage units in a second storage set is identified. A new storage set weight for the second storage set is generated when the number of storage units in the failing set compares favorably to a failure threshold number. A second data migration that includes transferring data slices stored in the second storage unit to other storage sets is facilitated based on the storage set weights.

20 Claims, 7 Drawing Sheets

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 8,370,312 B1 * | 2/2013 | Sawhney ............ H04L 67/1097 707/694 |
| 8,555,109 B2 | 10/2013 | Dhuse et al. |
| 8,769,035 B2 | 7/2014 | Resch et al. |
| 8,819,482 B2 | 8/2014 | Dhuse et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll, Jr. |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters, III et al. |
| 2008/0184000 A1 * | 7/2008 | Kawaguchi ............ G06F 3/0608 711/165 |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2011/0029524 A1 | 2/2011 | Baptist et al. |
| 2011/0029753 A1 | 2/2011 | Baptist et al. |
| 2011/0029836 A1 | 2/2011 | Dhuse et al. |
| 2015/0378626 A1 * | 12/2015 | Motwani ................ G06F 3/067 711/114 |
| 2016/0378395 A1 * | 12/2016 | Baptist ................ G06F 11/1092 711/165 |
| 2017/0286239 A1 * | 10/2017 | Baptist ................ G06F 11/1076 |
| 2018/0232276 A1 * | 8/2018 | Baptist ................ G06F 11/1092 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner

HANDLING STORAGE UNIT FAILURE IN A DISPERSED STORAGE NETWORK

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

DETAILED DESCRIPTION OF THE INVENTION

Figure 1:
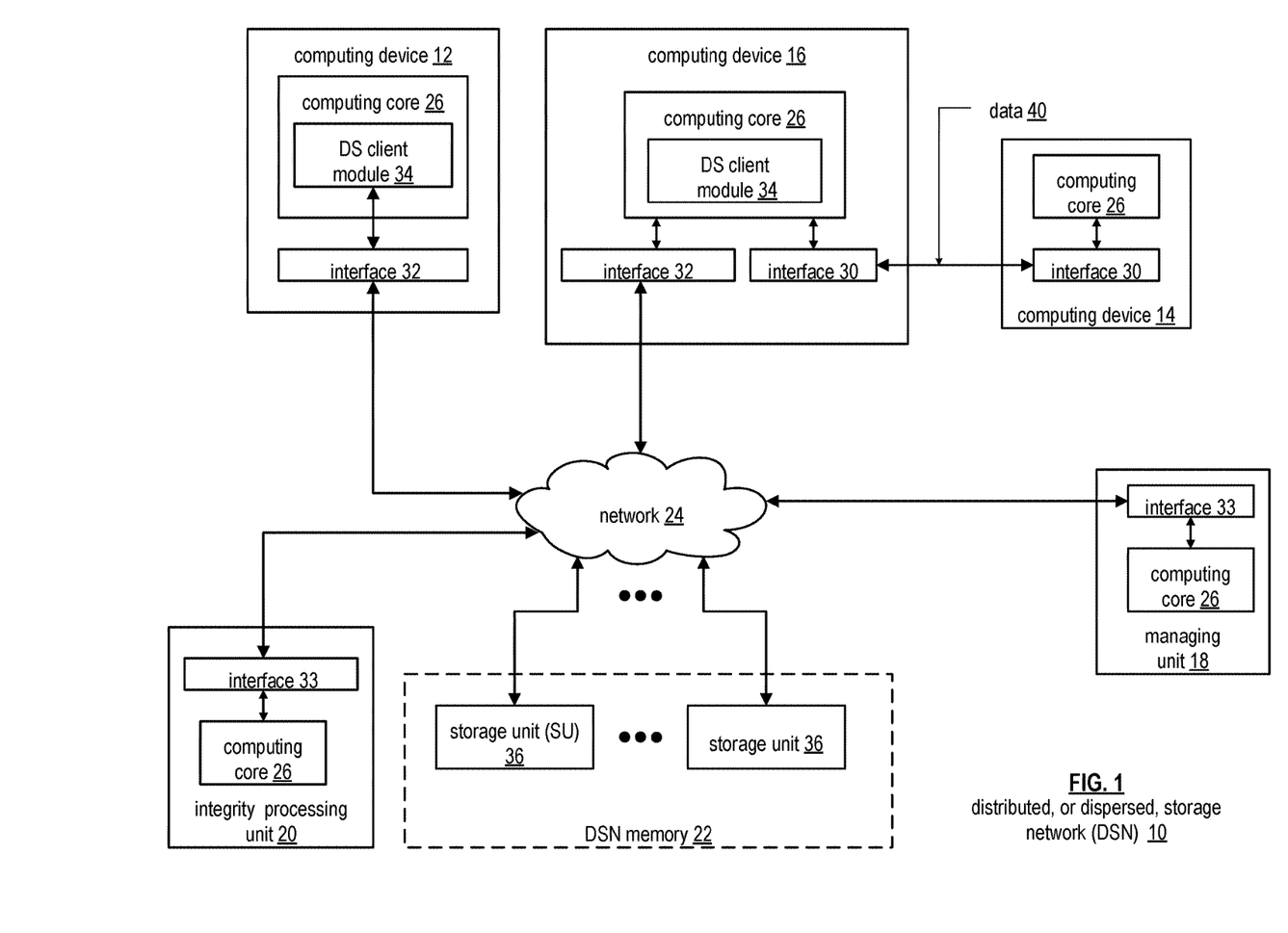
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
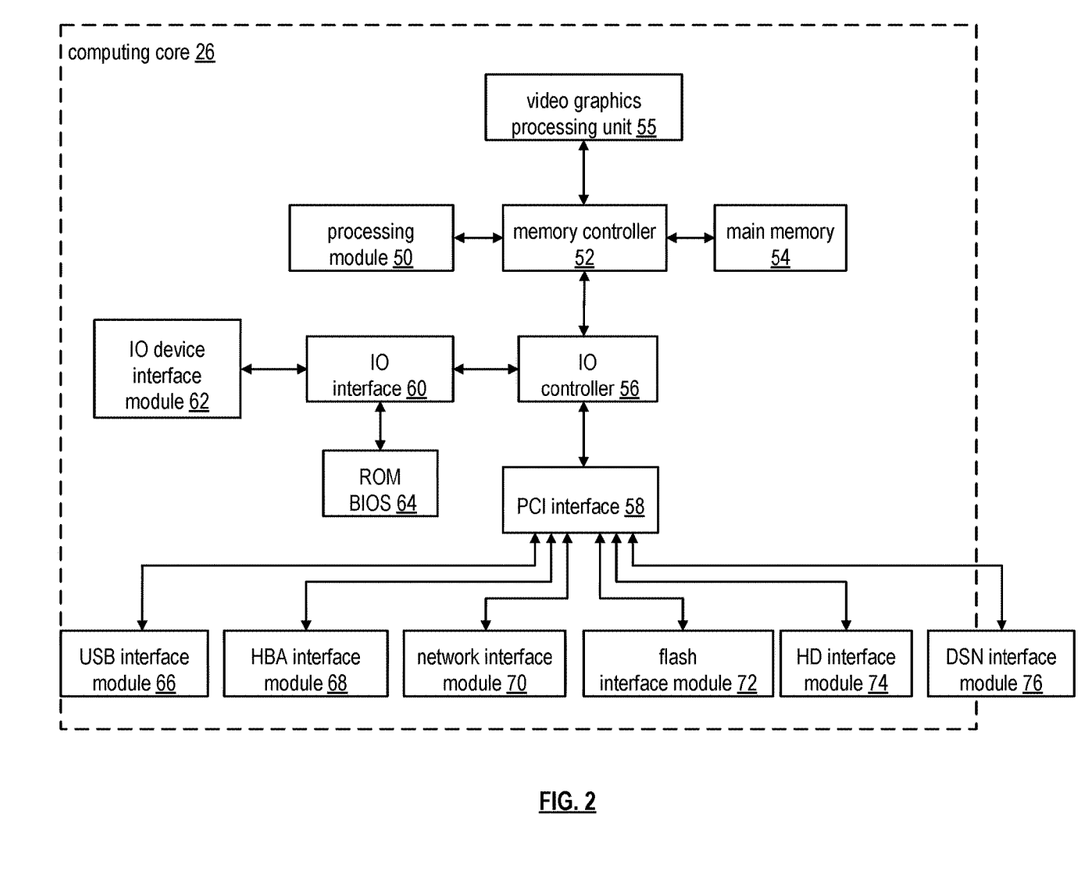
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

In various embodiments, each of the storage units operates as a distributed storage and task (DST) execution unit, and is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. Hereafter, a storage unit may be interchangeably referred to as a dispersed storage and task (DST) execution unit and a set of storage units may be interchangeably referred to as a set of DST execution units.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each managing unit 18 and the integrity processing unit 20 may be separate computing devices, may be a common computing device, and/or may be integrated into one or more of the computing devices 12-16 and/or into one or more of the storage units 36. In various embodiments, computing devices 12-16 can include user devices and/or can be utilized by a requesting entity generating access requests, which can include requests to read or write data to storage units in the DSN.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figures 3, 4:
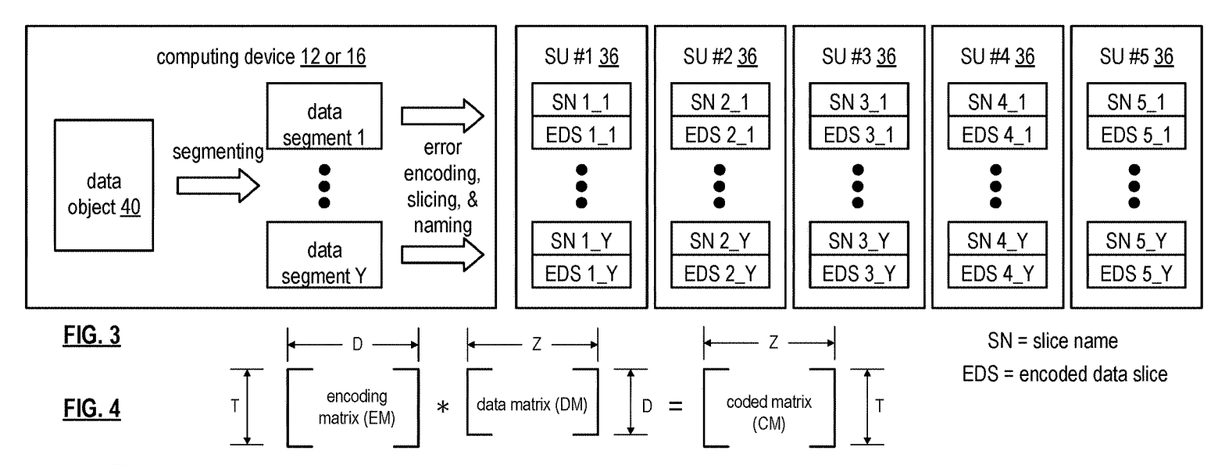
FIG. 3 is a schematic block diagram of an example of dispersed storage error encoding of data in accordance with the present invention.
FIG. 4 is a schematic block diagram of a generic example of an error encoding function in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. Here, the computing device stores data object 40, which can include a file (e.g., text, video, audio, etc.), or other data arrangement. The dispersed storage error encoding parameters include an encoding function (e.g., information dispersal algorithm (IDA), Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figure 5:
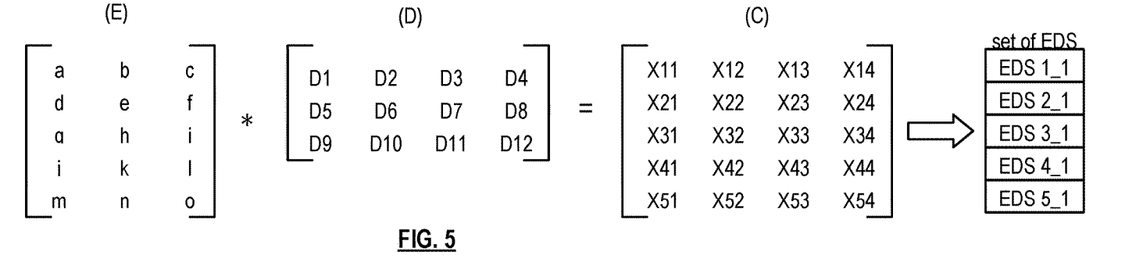
FIG. 5 is a schematic block diagram of a specific example of an error encoding function in accordance with the present invention.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides data object 40 into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Figure 6:
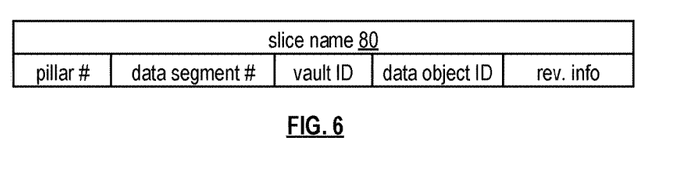
FIG. 6 is a schematic block diagram of an example of a slice name of an encoded data slice (EDS) in accordance with the present invention.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
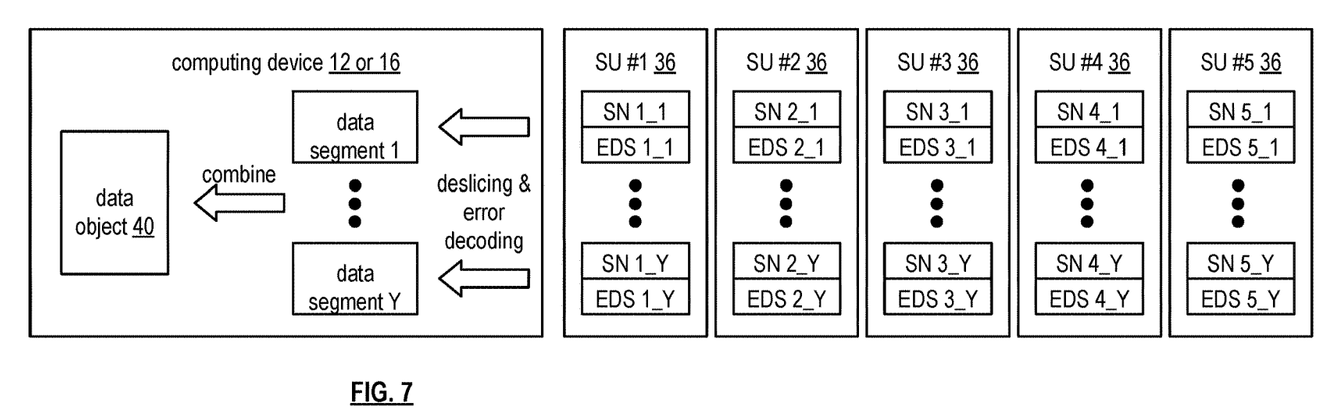
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
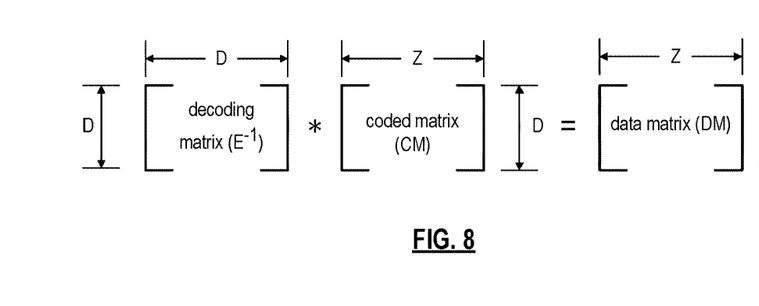
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
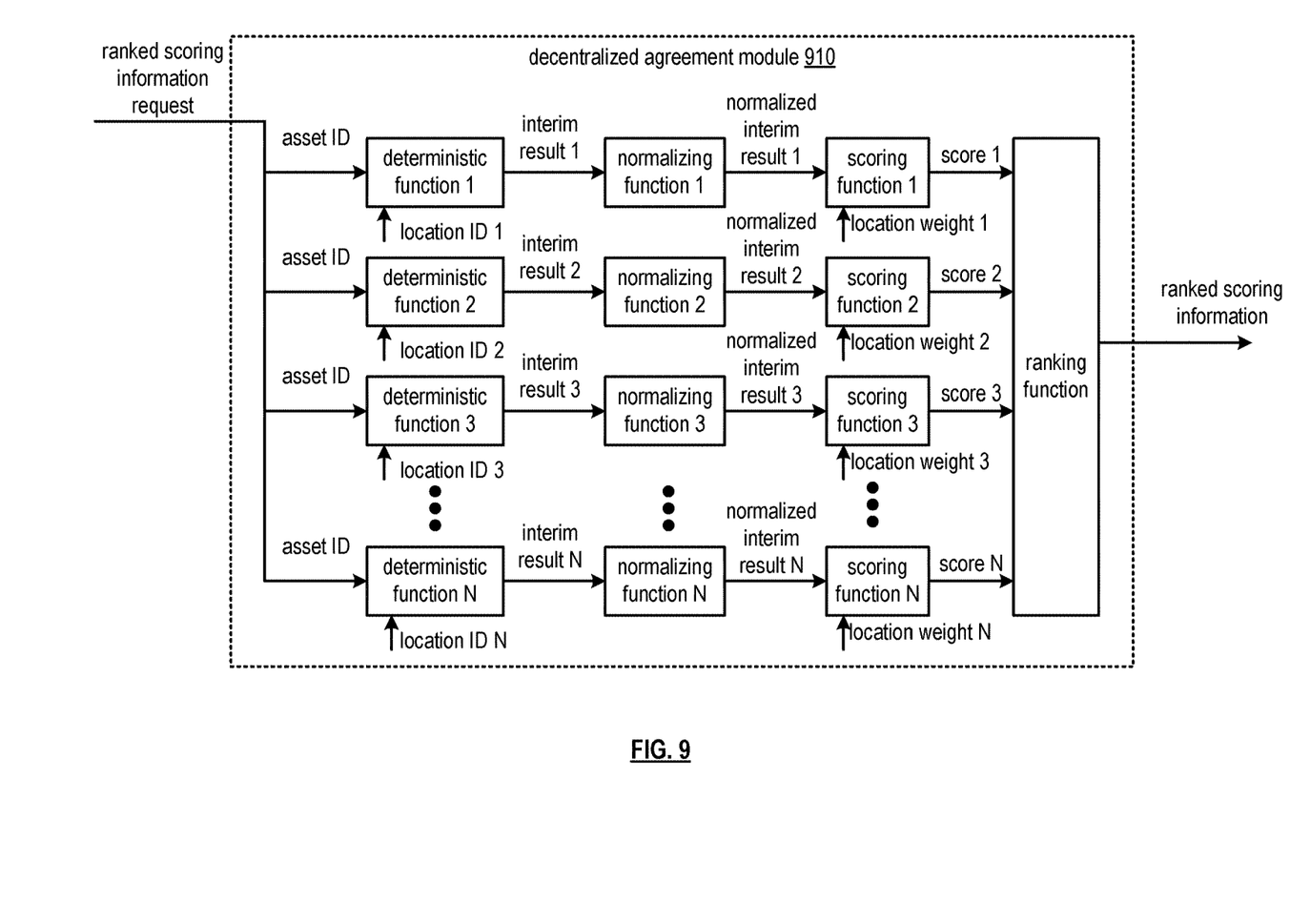
FIG. 9 is a schematic block diagram of a decentralized agreement module in accordance with the present invention.

FIG. 9 is a schematic block diagram of an embodiment of a decentralized agreement module 910 that includes a set of deterministic functions 1-N, a set of normalizing functions 1-N, a set of scoring functions 1-N, and a ranking function. Each of the deterministic function, the normalizing function, the scoring function, and the ranking function, may be implemented utilizing the processing module 50 of FIG. 2. The decentralized agreement module may be implemented utilizing any module and/or unit of a dispersed storage network (DSN). For example, the decentralized agreement module is implemented utilizing the distributed storage and task (DST) client module 34 of FIG. 1.

The decentralized agreement module functions to receive a ranked scoring information request and to generate ranked scoring information based on the ranked scoring information request and other information. The ranked scoring information request includes one or more of an asset identifier (ID) of an asset associated with the request, an asset type indicator, one or more location identifiers of locations associated with the DSN, one or more corresponding location weights, and a requesting entity ID. The asset includes any portion of data associated with the DSN including one or more asset types including a data object, a data record, an encoded data slice, a data segment, a set of encoded data slices, and a plurality of sets of encoded data slices. As such, the asset ID of the asset includes one or more of a data name, a data record identifier, a source name, a slice name, and a plurality of sets of slice names.

Each location of the DSN includes an aspect of a DSN resource. Examples of locations includes one or more of a storage unit, a memory device of the storage unit, a site, a storage pool of storage units, a pillar index associated with each encoded data slice of a set of encoded data slices generated by an information dispersal algorithm (IDA), a DS client module 34 of FIG. 1, a computing device 16 of FIG. 1, an integrity processing unit 20 of FIG. 1, a managing unit 18 of FIG. 1, a computing device 12 of FIG. 1, and a computing device 14 of FIG. 1.

Each location is associated with a location weight based on one or more of a resource prioritization of utilization scheme and physical configuration of the DSN. The location weight includes an arbitrary bias which adjusts a proportion of selections to an associated location such that a probability that an asset will be mapped to that location is equal to the location weight divided by a sum of all location weights for all locations of comparison. For example, each storage pool of a plurality of storage pools is associated with a location weight based on storage capacity. For instance, storage pools with more storage capacity are associated with higher location weights than others. The other information may include a set of location identifiers and a set of location weights associated with the set of location identifiers. For example, the other information includes location identifiers and location weights associated with a set of memory devices of a storage unit when the requesting entity utilizes the decentralized agreement module to produce ranked scoring information with regards to selection of a memory device of the set of memory devices for accessing a particular encoded data slice (e.g., where the asset ID includes a slice name of the particular encoded data slice).

The decentralized agreement module outputs substantially identical ranked scoring information for each ranked scoring information request that includes substantially identical content of the ranked scoring information request. For example, a first requesting entity issues a first ranked scoring information request to the decentralized agreement module and receives first ranked scoring information. A second requesting entity issues a second ranked scoring information request to the decentralized agreement module and receives second ranked scoring information. The second ranked scoring information is substantially the same as the first ranked scoring information when the second ranked scoring information request is substantially the same as the first ranked scoring information request.

As such, two or more requesting entities may utilize the decentralized agreement module to determine substantially identical ranked scoring information. As a specific example, the first requesting entity selects a first storage pool of a plurality of storage pools for storing a set of encoded data slices utilizing the decentralized agreement module and the second requesting entity identifies the first storage pool of the plurality of storage pools for retrieving the set of encoded data slices utilizing the decentralized agreement module.

In an example of operation, the decentralized agreement module receives the ranked scoring information request. Each deterministic function performs a deterministic function on a combination and/or concatenation (e.g., add, append, interleave) of the asset ID of the request and an associated location ID of the set of location IDs to produce an interim result. The deterministic function includes at least one of a hashing function, a hash-based message authentication code function, a mask generating function, a cyclic redundancy code function, hashing module of a number of locations, consistent hashing, rendezvous hashing, and a sponge function. As a specific example, deterministic function 2 appends a location ID 2 of a storage pool 2 to a source name as the asset ID to produce a combined value and performs the mask generating function on the combined value to produce interim result 2.

With a set of interim results 1-N, each normalizing function performs a normalizing function on a corresponding interim result to produce a corresponding normalized interim result. The performing of the normalizing function includes dividing the interim result by a number of possible permutations of the output of the deterministic function to produce the normalized interim result. For example, normalizing function 2 performs the normalizing function on the interim result 2 to produce a normalized interim result 2.

With a set of normalized interim results 1-N, each scoring function performs a scoring function on a corresponding normalized interim result to produce a corresponding score. The performing of the scoring function includes dividing an associated location weight by a negative log of the normalized interim result. For example, scoring function 2 divides location weight 2 of the storage pool 2 (e.g., associated with location ID 2) by a negative log of the normalized interim result 2 to produce a score 2.

With a set of scores 1-N, the ranking function performs a ranking function on the set of scores 1-N to generate the ranked scoring information. The ranking function includes rank ordering each score with other scores of the set of scores 1-N, where a highest score is ranked first. As such, a location associated with the highest score may be considered a highest priority location for resource utilization (e.g., accessing, storing, retrieving, etc., the given asset of the request). Having generated the ranked scoring information, the decentralized agreement module outputs the ranked scoring information to the requesting entity.

Figure 10:
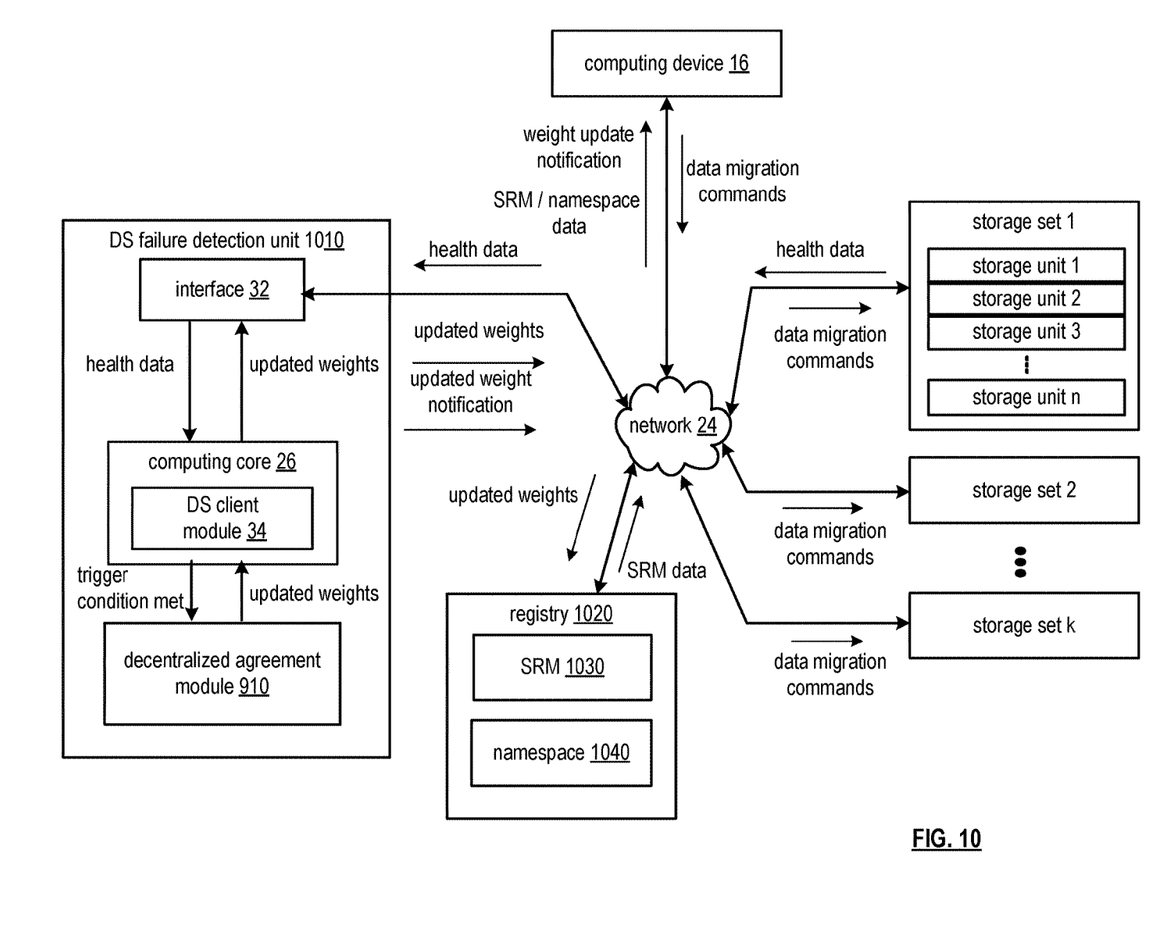
FIG. 10 is a schematic block diagram of an embodiment of a dispersed or distributed storage network (DSN) in accordance with the present invention.

FIG. 10 is a schematic block diagram of another embodiment of a dispersed storage network (DSN) that includes at least one dispersed storage (DS) failure detection unit 1010, the computing device 16 of FIG. 1, a registry 1020, the network 24 of FIG. 1, and a plurality of storage sets 1-k that each include a plurality of storage units 1-n. Each storage set can contain the same number or a different number of storage units. Each storage unit may be implemented utilizing the storage unit 36 of FIG. 1. The DS failure detection unit can include the interface 30, 32, or 33 of FIG. 1, computing core 26 of FIG. 1, and/or the DS client module 34 of FIG. 1. The DS failure detection unit can also include the decentralized agreement module 910 of FIG. 9. The DS failure detection unit can also be implemented by utilizing computing device 12-16, management unit 18, storage unit 36, and/or integrity processing unit 20 of FIG. 1. The DS failure detection unit can communicate with one or more of computing device 12, 14 and/or 16, management unit 18, and/or integrity processing unit 20 of FIG. 1 via network 24, for example, to retrieve storage unit status, update registry information, to facilitate data migration and/or storage unit removal, and/or to execute other functions as described herein. The registry 1020 can include a Storage Resource Map (SRM) 1030 and/or a namespace 1040. The registry 1020 can implemented by utilizing computing core 26, for example, where the SRM and namespace are included in memory 54. The registry 1020 can also be included in the memory of another element of the DSN, such as management unit 18. The DSN functions to handle storage unit failure, allowing devices to "fail in place", optionally with no user intervention.

A DSN memory deployment can be composed of one or more storage pools, where each storage pool includes one or more storage sets of storage units. For example, each pool can include a DS failure detection unit 1010 that is responsible for the storage sets of its storage pool. Each storage set is assigned a weight in a Storage Resource Map (SRM) 1030 which can be used to determine what share of data that set holds within the storage pool, and different storage pools of the DSN can utilize the same or different SRMs. The SRM is used in conjunction with the namespace to determine where data is written. The SRM, storage set weights, storage unit weights, and/or the namespace can be stored in a registry 1020 of the DSN, in memory, such as memory 54, of the computing core of the DS failure detection unit 1010, and/or in another memory of the DSN, for example, in the management unit or integrity processing unit. The storage set weight can be a function of weights of the storage units of the storage set, and can be for example the sum of individual storage unit weights, the average storage unit weight multiplied by the number of storage units, the average of the weights of a threshold of storage units, or some other number relating to the storage capacity of the storage set. In various embodiments, the decentralized agreement module 910, for example, included in the DS failure detection unit or included in another element of the DSN, can be used in conjunction with generating the storage unit weights and/or storage set weights to initiate and maintain the SRM. Storage unit weights can be determined such that they are proportional to the storage capacity of each storage in a storage set. As an example, the storage unit weight could be sum of the byte capacity of all drives in the storage unit, a quantized number such as the TB capacity of all drives, a count of drives, or some other value. Storage unit weights can also be smaller than the actual capacity of a device, for example, to account for some amount of "failure overhead." Storage unit weights of the SRM can be used by elements of the DSN such as computing devices 12-16 to determine which storage units data should be written to, read from, or rebuild to and from. The scheme used to place data can be another SRM that is applied at the storage set level on devices, a linear namespace adjustment, and/or some other name mapping mechanism.

When the storage capacity or health of a storage unit changes, for example, if a drive of a storage unit fails, the system can be configured such that the registry is updated with a new weight for that storage unit. This update can occur immediately, or after a trigger condition such as all drive "overhead" being exhausted. If current conditions of the storage unit meet or otherwise compare favorably to a weight-adjustment trigger condition, a new weight for the storage unit can be generated. Such weight-adjustment trigger conditions can be based on the storage capacity of the storage unit, number of operational drives of the storage unit, health data of the storage unit, and/or other conditions indicating that the storage unit is not meeting threshold standards. The new weight assigned to the identified storage unit can be generated by utilizing the decentralized agreement module and/or DS failure detection unit, and the SRM can be updated accordingly. The weights in the SRM can also be updated by the storage units themselves, for example, if storage units monitor their own status and/or determine themselves if they meet the trigger condition, generate their own new weight in response, and/or send the new weight to the registry or other memory responsible for the SRM. The new weights can also be communicated to the management unit or another coordination device which updates the registry by the storage unit and/or failure detection unit.

When a storage unit weight is changed, the namespace owned by each storage unit changes. Either immediately or after an automatic or manual action triggered by the management unit or some other means, data I/O, for example facilitated by requests from computing device 16 or another unit, will be redirected to new storage units, and a data migration procedure will begin in accordance with the updated weight and the other storage unit weights of the SRM. Additionally, when a storage unit reaches some trigger condition, such as drive failures hit some low threshold or all drives failed, the storage unit itself may be removed from the storage set. Its weight can be set to zero to allow migration of data to other storage units in the storage set and the storage unit may eventually be removed entirely from the registry. The DS failure detection unit or a computing device 16 can initiate and/or facilitate a data migration of data from the identified storage unit based on the new storage unit weight and the other storage unit weights of storage units in the storage set retrieved from the SRM. In various embodiments, a new weight will be assigned to a storage unit as a result of other and perhaps more favorable changes to the storage unit status, such as a freeing up of available storage and/or repair or addition of storage. In such examples, the resulting data migration can result in data being transferred to the storage unit from other storage units. In various embodiments, multiple triggers corresponding to multiple different conditions that necessitate a weight change can be utilized, and the status of the storage unit with respect to multiple conditions can be monitored.

When the storage unit weight is modified, by extension a new weight can be automatically generated for its corresponding storage set. Alternatively, in various embodiments, the weight for the storage set is only updated when the weights of a threshold of storage units have decreased, or some other trigger condition relating to status of the storage set has been met. For example, when a certain threshold (e.g. width, write threshold, decode threshold, read threshold, or similar maximum accepted failure tolerance) of storage units "fail" in this manner, a trigger condition can result in the entire storage set likewise being removed from the storage pool. Possible trigger conditions include a threshold of devices being removed, the number of active storage units being lower than any vault widths or thresholds, or another condition that necessitates a change in a storage set's weight. For example, when a number of identified failing storage units in a storage set compares favorably to a threshold number of failing storage units, this trigger condition will be met and the storage set can be assigned a new weight. For example, the DS failure detection unit will determine when this storage set weight-adjustment trigger condition is met, and will facilitate generation of the new weight and/or the resulting data migration. In various embodiments, when this storage set weight-adjustment trigger condition is met, the storage set will be assigned a weight of zero, and migration of all data to other storage sets will be performed. When a storage set is removed, some or all storage units that have not failed in that storage set may be repurposed either manually or automatically into existing storage sets. For example, a storage unit that still has more than some threshold of active drives may be placed into other storage sets, such as the storage set with the least number of active storage units. This update can be reflected by updating registry information, updating the SRM, and/or updating the namespace. In various embodiments, the reverse situation can also act as a trigger condition. For example, a storage set that was previously not meeting a threshold number of active storage units, can trigger a weight change in response to one or more storage units being repaired or added to the storage set, and the resulting data migration can include transfer of data from other storage sets back to the refurbished storage set.

The DS failure detection unit can be responsible for monitoring storage unit conditions, determining when trigger conditions have been met, assigning new weights, and/or facilitating the resulting data migration, for example, when implemented as part of a computing device 16. The DS failure detection unit can also communicate with other elements of the DSN to facilitate execution of some or all of these functions. For example, the DS failure detection unit can facilitate the migration by notifying another DS unit such as computing device 16 or managing unit 18 of the updated weights, and the other DS unit can be responsible for executing the migration in response based on retrieving updated SRM data and/or namespace from the registry. In various embodiments, other DS units such as the storage unit 36 and/or computing device 16 can include their own decentralized agreement module to aid in generating and/or processing updated weights and executing migration of data.

In various embodiments, a processing system dispersed storage (DS) failure detection unit includes at least one processor and a memory that stores operational instructions, that when executed by the at least one processor cause the processing system to generate a plurality of storage unit weights corresponding to a plurality of storage units. A plurality of storage set weights corresponding to a plurality of storage sets are generated, where each of the plurality of storage sets includes a subset of the plurality of storage units, and where each of the plurality of storage set weights is based on the storage unit weights of the corresponding subset of storage units. One of the plurality of storage units that meets a weight-adjustment trigger condition is identified, and a new storage unit weight for the identified one of the plurality of storage units is generated in response. A first data migration is facilitated within a first one of the plurality of storage sets that includes the identified one of the plurality of storage units based on the plurality of storage unit weights, where the first data migration includes transferring data slices stored in the identified one of the plurality of storage units to at least one other storage unit in the first one of the plurality of storage sets. A failing set of storage units in a second one of the plurality of storage sets that meet the weight-adjustment trigger condition is identified. A new storage set weight for the second one of the plurality of storage sets is generated in response to determining that a number of the identified storage units in the failing set compares favorably to a failure threshold number. A second data migration is facilitated based on the plurality of storage set weights, where the second data migration includes transferring data slices stored in the subset of storage units of the second one of the plurality of storage sets to storage units in at least one other storage set.

In various embodiments, generating the plurality of storage set weights includes at least one of: calculating a sum of storage unit weights of the corresponding subset of storage units or calculating an average of storage unit weights of the corresponding subset of storage units. In various embodiments, a plurality of storage unit weights of the storage units of a storage set are proportional to a storage capacity of each storage unit in the storage set.

In various embodiments, a namespace of the DSN is updated based on the new storage unit weight and the new storage set weight. A computing device of the DSN can determine at least one destination storage unit for new data object in a write request based on the updated namespace. In various embodiments, a new storage set weight is generated for the first one of the plurality of storage sets based on the new storage unit weight for the identified one of the plurality of storage units. In various embodiments, new storage unit weight for the identified one of the plurality of storage units is set to zero, and the first data migration includes transferring every data slice stored in the identified one of the plurality of storage units to at least one other storage unit in the first one of the plurality of storage sets. The identified one of the plurality of storage units is removed from a registry of the DSN. In various embodiments, the failure threshold number is based on at least one of: a decode threshold, a read threshold, or a write threshold of an information dispersal algorithm associated with storage of data objects in the DSN.

In various embodiments, an active storage unit in the second one of the plurality of storage sets that compares unfavorably to the weight-adjustment trigger condition is identified, and the identified active storage unit to a different one of the plurality of storage sets. In various embodiments, generating a new storage set weight for the different one of the plurality of storage sets in response to the reassignment based on a storage unit weight corresponding to the active storage unit. In various embodiments, every storage that is included in the subset of storage units of the second one of the plurality of storage sets and is not included in the failing set of storage units is reassigned to a different one of the plurality of storage sets.

Figure 11:
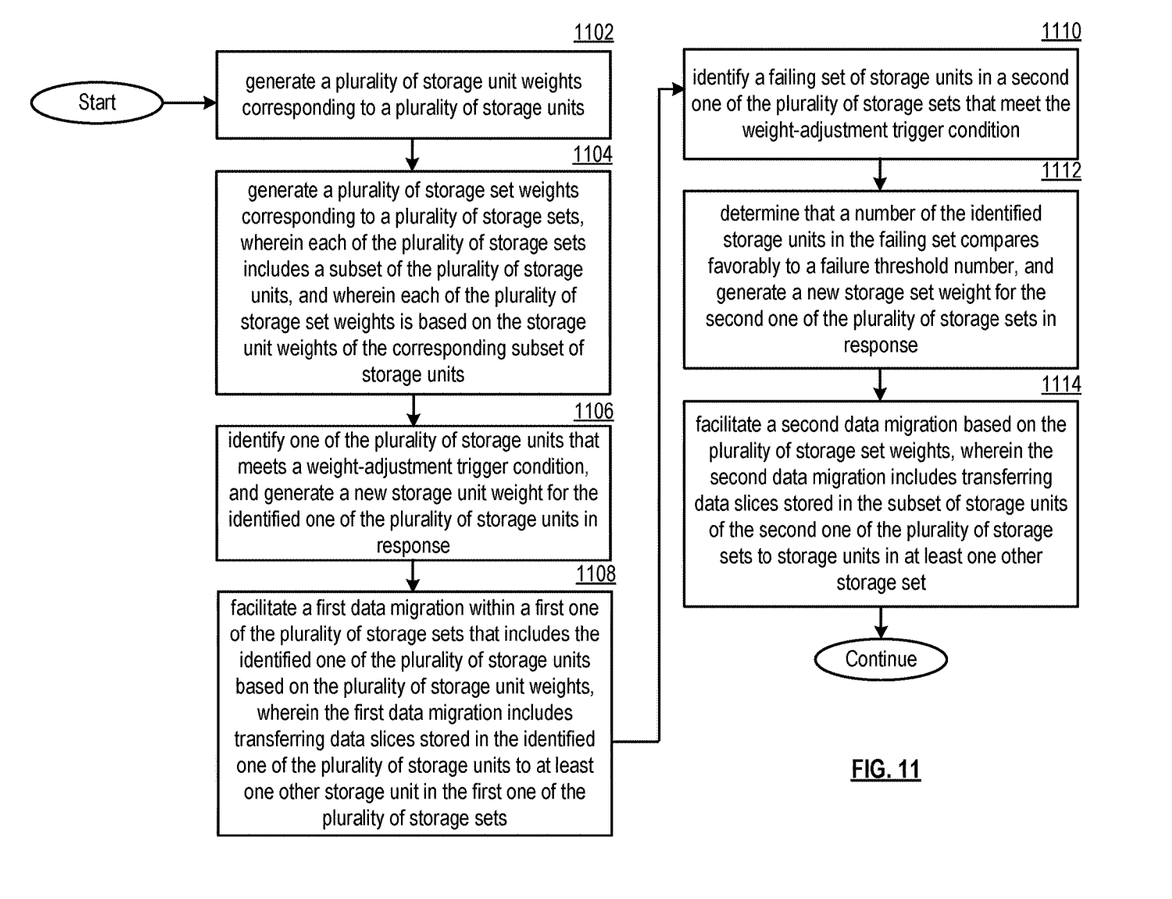
FIG. 11 is a logic diagram of an example of a method of handling storage unit failure in accordance with the present invention.

FIG. 11 is a flowchart illustrating an example of handling storage unit failures in a DSN. In particular, a method is presented for use in association with one or more functions and features described in conjunction with FIGS. 1-10, for execution by a dispersed storage (DS) failure detection unit that includes a processor or via another processing system of a dispersed storage network that includes at least one processor and memory that stores instruction that configure the processor or processors to perform the steps described below.

Step 1102 includes generating a plurality of storage unit weights corresponding to a plurality of storage units. For example, the storage unit weights can be proportional to a storage capacity of each storage unit in a storage set.

Step 1104 includes generating a plurality of storage set weights corresponding to a plurality of storage sets. Each of the plurality of storage sets includes a subset of the plurality of storage units, and each of the plurality of storage set weights is based on the storage unit weights of the corresponding subset of storage units. For example, generating the plurality of storage set weights can include calculating a sum of storage unit weights of the corresponding subset of storage units or calculating an average of storage unit weights of the corresponding subset of storage units.

Step 1106 includes identifying one of the plurality of storage units that meets a weight-adjustment trigger condition. A new storage unit weight for the identified one of the plurality of storage units is generated in response. In various embodiments, a namespace of the DSN can be updated based on the new storage unit weight and the new storage set weight, allowing one or more computing devices of the DSN to determine one or more destination storage units for a new data object of a write request based on the updated namespace. In various embodiments, a new storage set weight for the first one of the plurality of storage sets is generated based on the new storage unit weight for the identified one of the plurality of storage units.

Step 1108 includes facilitating a first data migration within a first one of the plurality of storage sets that includes the identified one of the plurality of storage units based on the plurality of storage unit weights. The first data migration includes transferring data slices stored in the identified one of the plurality of storage units to at least one other storage unit in the first one of the plurality of storage sets. For example, when new storage unit weight for the identified one of the plurality of storage units is set to zero, the first data migration includes transferring every data slice stored in the identified one of the plurality of storage units to at least one other storage unit in the first one of the plurality of storage sets, and the identified one of the plurality of storage units is removed from a registry of the DSN.

Step 1110 includes identifying a failing set of storage units in a second one of the plurality of storage sets that meet the weight-adjustment trigger condition.

Step 1112 includes determining that a number of the identified storage units in the failing set compares favorably to a failure threshold number. A new storage set weight for the second one of the plurality of storage sets is generated in response. For example, the failure threshold can be based on a decode threshold, a read threshold, or a write threshold of an information dispersal algorithm associated with storage of data objects in the DSN.

Step 1114 includes facilitating a second data migration based on the plurality of storage set weights. The second data migration includes transferring data slices stored in the subset of storage units of the second one of the plurality of storage sets to storage units in at least one other storage set. In various embodiments, an active storage unit in the second one of the plurality of storage sets that compares unfavorably to the weight-adjustment trigger condition is identified, and the identified active storage unit is reassigned to a different one of the plurality of storage sets. For example, every storage that is included in the subset of storage units of the second one of the plurality of storage sets and is not included in the failing set of storage units is reassigned to a different one of the plurality of storage sets. A new storage set weight can be generated for the different one of the plurality of storage sets in response to the reassignment based on a storage unit weight corresponding to the active storage unit.

In various embodiments, a non-transitory computer readable storage medium includes at least one memory section that stores operational instructions that, when executed by a processing system of a dispersed storage network (DSN) that includes a processor and a memory, causes the processing system to generate a plurality of storage unit weights corresponding to a plurality of storage units. A plurality of storage set weights corresponding to a plurality of storage sets are generated, where each of the plurality of storage sets includes a subset of the plurality of storage units, and where each of the plurality of storage set weights is based on the storage unit weights of the corresponding subset of storage units. One of the plurality of storage units that meets a weight-adjustment trigger condition is identified, and a new storage unit weight for the identified one of the plurality of storage units is generated in response. A first data migration is facilitated within a first one of the plurality of storage sets that includes the identified one of the plurality of storage units based on the plurality of storage unit weights, where the first data migration includes transferring data slices stored in the identified one of the plurality of storage units to at least one other storage unit in the first one of the plurality of storage sets. A failing set of storage units in a second one of the plurality of storage sets that meet the weight-adjustment trigger condition is identified. A new storage set weight for the second one of the plurality of storage sets is generated in response to determining that a number of the identified storage units in the failing set compares favorably to a failure threshold number. A second data migration is facilitated based on the plurality of storage set weights, where the second data migration includes transferring data slices stored in the subset of storage units of the second one of the plurality of storage sets to storage units in at least one other storage set.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a dispersed storage DS failure detection unit of a dispersed storage network (DSN) that includes a processor, the method comprises:
   generating a plurality of storage unit weights corresponding to a plurality of storage units;
   generating a plurality of storage set weights corresponding to a plurality of storage sets, wherein each of the plurality of storage sets includes a subset of the plurality of storage units, and wherein each of the plurality of storage set weights is based on the storage unit weights of the corresponding subset of storage units;
   identifying one of the plurality of storage units that meets a weight-adjustment trigger condition, and generating a new storage unit weight for the identified one of the plurality of storage units in response;
   facilitating a first data migration within a first one of the plurality of storage sets that includes the identified one of the plurality of storage units based on the plurality of storage unit weights, wherein the first data migration includes transferring data slices stored in the identified one of the plurality of storage units to at least one other storage unit in the first one of the plurality of storage sets;
   identifying a failing set of storage units in a second one of the plurality of storage sets that meet the weight-adjustment trigger condition;
   determining that a number of the identified storage units in the failing set compares favorably to a failure threshold number, and generating a new storage set weight for the second one of the plurality of storage sets in response; and
   facilitating a second data migration based on the plurality of storage set weights, wherein the second data migration includes transferring data slices stored in the subset of storage units of the second one of the plurality of storage sets to storage units in at least one other storage set.

2. The method of claim 1, wherein generating the plurality of storage set weights includes at least one of: calculating a sum of storage unit weights of the corresponding subset of storage units or calculating an average of storage unit weights of the corresponding subset of storage units.

3. The method of claim 1, wherein the plurality of storage unit weights of the storage units of a storage set are proportional to a storage capacity of each storage unit in the storage set.

4. The method of claim 1, further comprising:
   updating a namespace of the DSN based on the new storage unit weight and the new storage set weight;
   wherein a computing device of the DSN determines at least one destination storage unit for new data object in a write request based on the updated namespace.

5. The method of claim 1, further comprising:
   generating a new storage set weight for the first one of the plurality of storage sets based on the new storage unit weight for the identified one of the plurality of storage units.

6. The method of claim 1, wherein the new storage unit weight for the identified one of the plurality of storage units is set to zero, wherein the first data migration includes transferring every data slice stored in the identified one of the plurality of storage units to at least one other storage unit in the first one of the plurality of storage sets, further comprising:
   removing the identified one of the plurality of storage units from a registry of the DSN.

7. The method of claim 1, wherein the failure threshold number is based on at least one of: a decode threshold, a read threshold, or a write threshold of an information dispersal algorithm associated with storage of data objects in the DSN.

8. The method of claim 1, further comprising:
   identifying an active storage unit in the second one of the plurality of storage sets that compares unfavorably to the weight-adjustment trigger condition; and
   reassigning the identified active storage unit to a different one of the plurality of storage sets.

9. The method of claim 8, further comprising:
   generating a new storage set weight for the different one of the plurality of storage sets in response to the reassignment based on a storage unit weight corresponding to the active storage unit.

10. The method of claim 8, wherein every storage that is included in the subset of storage units of the second one of the plurality of storage sets and is not included in the failing set of storage units is reassigned to a different one of the plurality of storage sets.

11. A processing system of a dispersed storage (DS) failure detection unit comprises:
    at least one processor;
    a memory that stores operational instructions, that when executed by the at least one processor cause the processing system to:
      generate a plurality of storage unit weights corresponding to a plurality of storage units;
      generate a plurality of storage set weights corresponding to a plurality of storage sets, wherein each of the plurality of storage sets includes a subset of the plurality of storage units, and wherein each of the plurality of storage set weights is based on the storage unit weights of the corresponding subset of storage units;
      identify one of the plurality of storage units that meets a weight-adjustment trigger condition, and generate a new storage unit weight for the identified one of the plurality of storage units in response;
      facilitate a first data migration within a first one of the plurality of storage sets that includes the identified one of the plurality of storage units based on the plurality of storage unit weights, wherein the first data migration includes transferring data slices stored in the identified one of the plurality of storage units to at least one other storage unit in the first one of the plurality of storage sets;
      identify a failing set of storage units in a second one of the plurality of storage sets that meet the weight-adjustment trigger condition;
      determine that a number of the identified storage units in the failing set compares favorably to a failure threshold number, and generate a new storage set weight for the second one of the plurality of storage sets in response; and
      facilitate a second data migration based on the plurality of storage set weights, wherein the second data migration includes transferring data slices stored in the subset of storage units of the second one of the plurality of storage sets to storage units in at least one other storage set.

12. The dispersed storage (DS) failure detection unit of claim 11, wherein generating the plurality of storage set weights includes at least one of: calculating a sum of storage unit weights of the corresponding subset of storage units or calculating an average of storage unit weights of the corresponding subset of storage units.

13. The dispersed storage (DS) failure detection unit of claim 11, wherein the operational instructions, when executed by the at least one processor, further cause the processing system to:
update a namespace based on the new storage unit weight and the new storage set weight;
wherein a computing device determines at least one destination storage unit for new data object in a write request based on the updated namespace.

14. The dispersed storage (DS) failure detection unit of claim 11, wherein the operational instructions, when executed by the at least one processor, further cause the processing system to:
generate a new storage set weight for the first one of the plurality of storage sets based on the new storage unit weight for the identified one of the plurality of storage units.

15. The dispersed storage (DS) failure detection unit of claim 11, wherein the new storage unit weight for the identified one of the plurality of storage units is set to zero, wherein the first data migration includes transferring every data slice stored in the identified one of the plurality of storage units to at least one other storage unit in the first one of the plurality of storage sets, and wherein the operational instructions, when executed by the at least one processor, further cause the processing system to:
remove the identified one of the plurality of storage units from a registry.

16. The dispersed storage (DS) failure detection unit of claim 11, wherein the failure threshold number is based on at least one of: a decode threshold, a read threshold, or a write threshold of an information dispersal algorithm associated with storage of data objects.

17. The dispersed storage (DS) failure detection unit of claim 11, wherein the operational instructions, when executed by the at least one processor, further cause the processing system to:
identify an active storage unit in the second one of the plurality of storage sets that compares unfavorably to the weight-adjustment trigger condition; and
reassign the identified active storage unit to a different one of the plurality of storage sets.

18. The dispersed storage (DS) failure detection unit of claim 17, wherein the operational instructions, when executed by the at least one processor, further cause the processing system to:
generate a new storage set weight for the different one of the plurality of storage sets in response to the reassignment based on a storage unit weight corresponding to the active storage unit.

19. The dispersed storage (DS) failure detection unit of claim 17, wherein every storage that is included in the subset of storage units of the second one of the plurality of storage sets and is not included in the failing set of storage units is reassigned to a different one of the plurality of storage sets.

20. A non-transitory computer readable storage medium comprises:
at least one memory section that stores operational instructions that, when executed by a processing system of a dispersed storage network (DSN) that includes a processor and a memory, causes the processing system to:
generate a plurality of storage unit weights corresponding to a plurality of storage units;
generate a plurality of storage set weights corresponding to a plurality of storage sets, wherein each of the plurality of storage sets includes a subset of the plurality of storage units, and wherein each of the plurality of storage set weights is based on the storage unit weights of the corresponding subset of storage units;
identify one of the plurality of storage units that meets a weight-adjustment trigger condition, and generate a new storage unit weight for the identified one of the plurality of storage units in response;
facilitate a first data migration within a first one of the plurality of storage sets that includes the identified one of the plurality of storage units based on the plurality of storage unit weights, wherein the first data migration includes transferring data slices stored in the identified one of the plurality of storage units to at least one other storage unit in the first one of the plurality of storage sets;
identify a failing set of storage units in a second one of the plurality of storage sets that meet the weight-adjustment trigger condition;
determine that a number of the identified storage units in the failing set compares favorably to a failure threshold number, and generate a new storage set weight for the second one of the plurality of storage sets in response; and
facilitate a second data migration based on the plurality of storage set weights, wherein the second data migration includes transferring data slices stored in the subset of storage units of the second one of the plurality of storage sets to storage units in at least one other storage set.

* * * * *